United States Patent [19]

Flanders et al.

[11] Patent Number: 4,618,261
[45] Date of Patent: Oct. 21, 1986

[54] OPTICAL GAP MEASURING

[75] Inventors: Dale C. Flanders, Lexington; Theodore M. Lyszczarz, Concord, both of Mass.

[73] Assignee: Massachusetts Institute of Technology, Cambridge, Mass.

[21] Appl. No.: 570,918

[22] Filed: Jan. 16, 1984

[51] Int. Cl.[4] ............................................. G01B 9/02
[52] U.S. Cl. .................................... 356/357; 356/358
[58] Field of Search ................ 356/352, 353, 357, 358

[56] References Cited

U.S. PATENT DOCUMENTS 4,072,423 2/1978 Kimura et al. ...................... 356/357
4,352,565 10/1982 Rowe et al. ................... 350/96.15 X

OTHER PUBLICATIONS

Green et al., "Corneal Thickness Measured by Interferometry" *JOSA*, vol. 65, No. 2, pp. 119-123, 2/75.
Kawasaki et al., "Modal-Noise Generation in Biconical-Taper Couplers", *Optics Letters*, vol. 6, No. 10, pp. 499-501, 10/81.

*Primary Examiner*—Davis L. Willis
*Assistant Examiner*—Matthew W. Koren
*Attorney, Agent, or Firm*—Charles Hieken

[57] ABSTRACT

A lens or fiberoptic cable focuses energy from a collimated helium neon laser beam upon a point on a mask. Some of the focused energy is reflected from the mask upon a photodetector array in an image plane, and some of this energy is reflected from a substrate closely adjacent to the mask after passing through the mask upon the photodetector array to produce an interference pattern that is sensed and characterized by a spatial frequency representative of the distance between the mask and substrate.

13 Claims, 13 Drawing Figures

OPTICAL GAP MEASURING

The Government has rights in this invention pursuant to Contract No. F19628-80-C-0002 awarded by the U.S. Air Force.

The present invention relates in general to gap measuring and more particularly concerns novel apparatus and techniques for precisely measuring mask-to-substrate gap with apparatus that is relatively inexpensive to fabricate and relatively easy to operate.

The control of the mask-to-substrate gap is critically important to the feature size and overlay performance of proximity printing lithography systems for making devices, such as large-scale integrated circuits. In those systems which employ point source illumination, such as by soft X-rays, variations in the gap affect the image magnification. Furthermore, the ability to achieve lateral alignment of mask and substrate may be impaired by the misadjustment of the gap.

Accordingly, it is an important object of this invention to provide improved apparatus and techniques for gap measurement.

According to the invention, there is means for focusing a collimated beam of optical energy upon a mask, such as energy from a helium neon laser. There is imaging, means, such as a linear imaging array, for receiving energy reflected from the mask and from the substrate after passing through the mask, to provide a signal representative of the interference pattern formed by the energy reflected from the mask interfering with the energy reflected from the substrate. To first order, the spatial frequency of the interference pattern is linearly dependent upon the mask-to-substrate gap. That is, the narrower the gap, the lower the spatial frequency, and the greater the distance between adjacent fringes. The imaging means may comprise a linear imaging array, such as a photodiode array, that provides a signal representative of the optical energy impinging on the respective elements in the array. These signals may be processed in accordance with known correlation techniques to determine the spatial frequency, and consequently, the mask-to-substrate gap width.

Numerous other features, objects and advantages of the invention will become apparent from the following specification when read in connection with the accompanying drawing in which:

FIGS. 7 and 7A are schematic illustrations of the invention using fiberoptic illumination;

Figure 1:
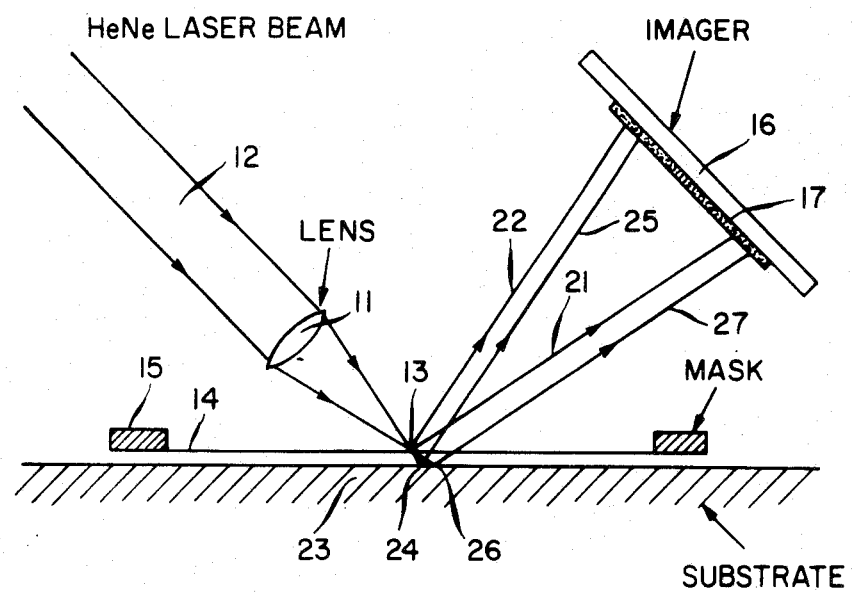
FIG. 1 is a diagrammatic representation of an embodiment of the invention.

With reference now to the drawing and more particularly FIG. 1 thereof, there is shown a diagrammatic representation of a system according to the invention. Lens 11 focuses energy from a collimated beam of light 12 typically provided by a helium neon laser, upon point 13 of mask 14 supported in mask frame 15 to reflect energy from point 13 upon imager 16, typically comprising a photoelectric diode array 17, between rays, such as 21 and 22.

Energy transmitted through point 13 of mask 14 also impinges upon substrate 23 and is reflected back through mask 14 upon imager 16, such as between rays 25 and 27 extending from points 24 and 26, respectively. There is a region of overlap on array 17 between rays 21 and 25 where energy reflected from both mask 14 and substrate 23 interfere to alternately add and subtract on array 17 to form an interference pattern characterized by a spatial frequency proportional to the gap between mask 14 and substrate 23.

Figure 2:
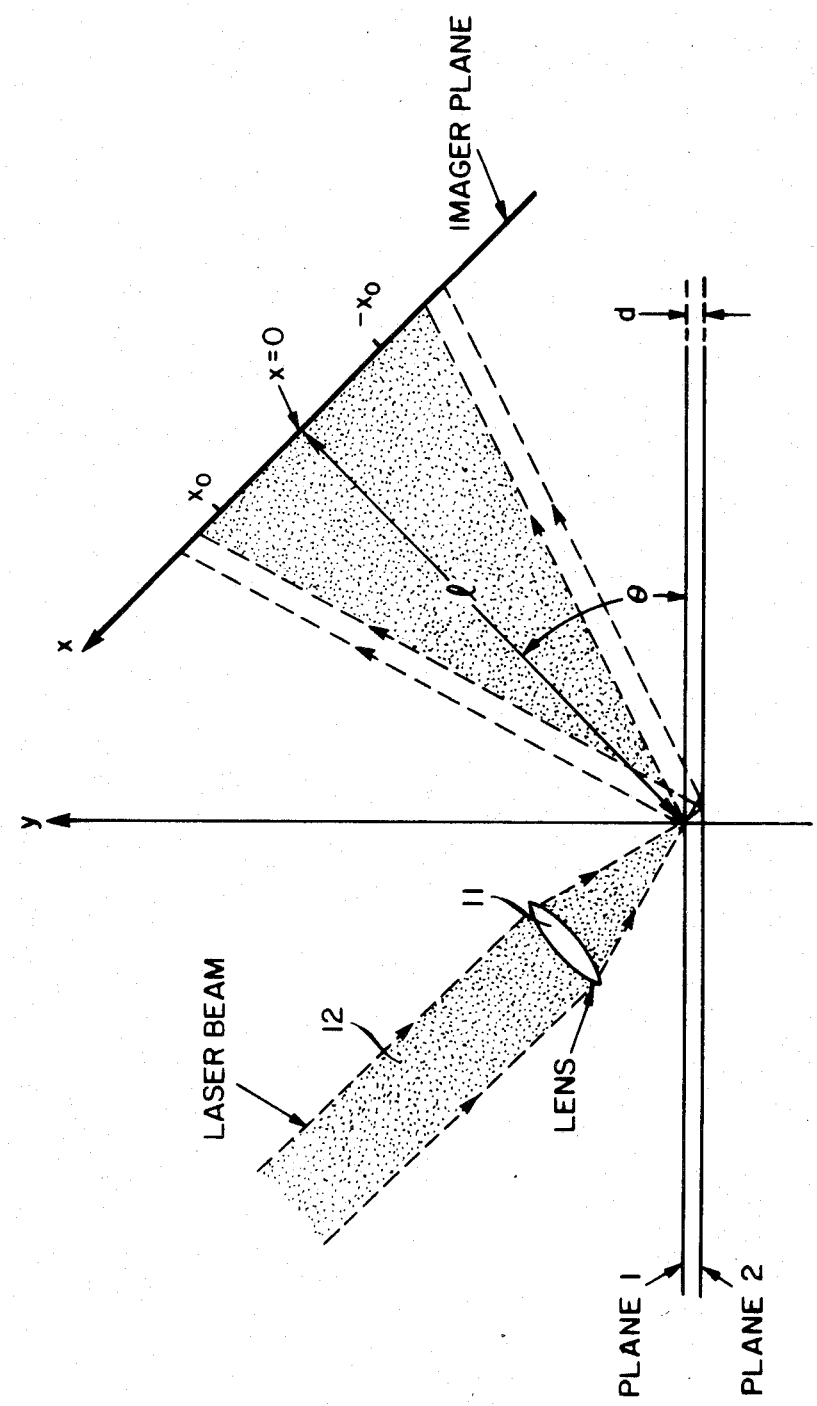
FIG. 2 is a diagrammatic representation of planes and angles for the system of FIG. 1 helpful in analyzing the interference patterns formed by energy reflected from the mask and energy reflected from the substrate.

Referring to FIG. 2, there is shown the various planes and angles of the system of FIG. 1 helpful in analyzing the interference pattern produced. It is convenient to designate the plane of mask 14 as plane 1, the plane of substrate 23 as plane 2, and the axis passing through point 14 perpendicular to these planes as the y axis. It is convenient to designate the axis through imaging array 17 as the imager plane and the axis coincident with it as the x axis. It is convenient to designate the point on this axis through which the perpendicular thereto of length l passing through point 13, as x=0, and points below and above, as minus x and plus x values, respectively. It is convenient to designate the angle between this perpendicular and the planes of mask 14 as $\theta$, and the gap width between mask 14 and substrate 23 as d.

Figure 3:
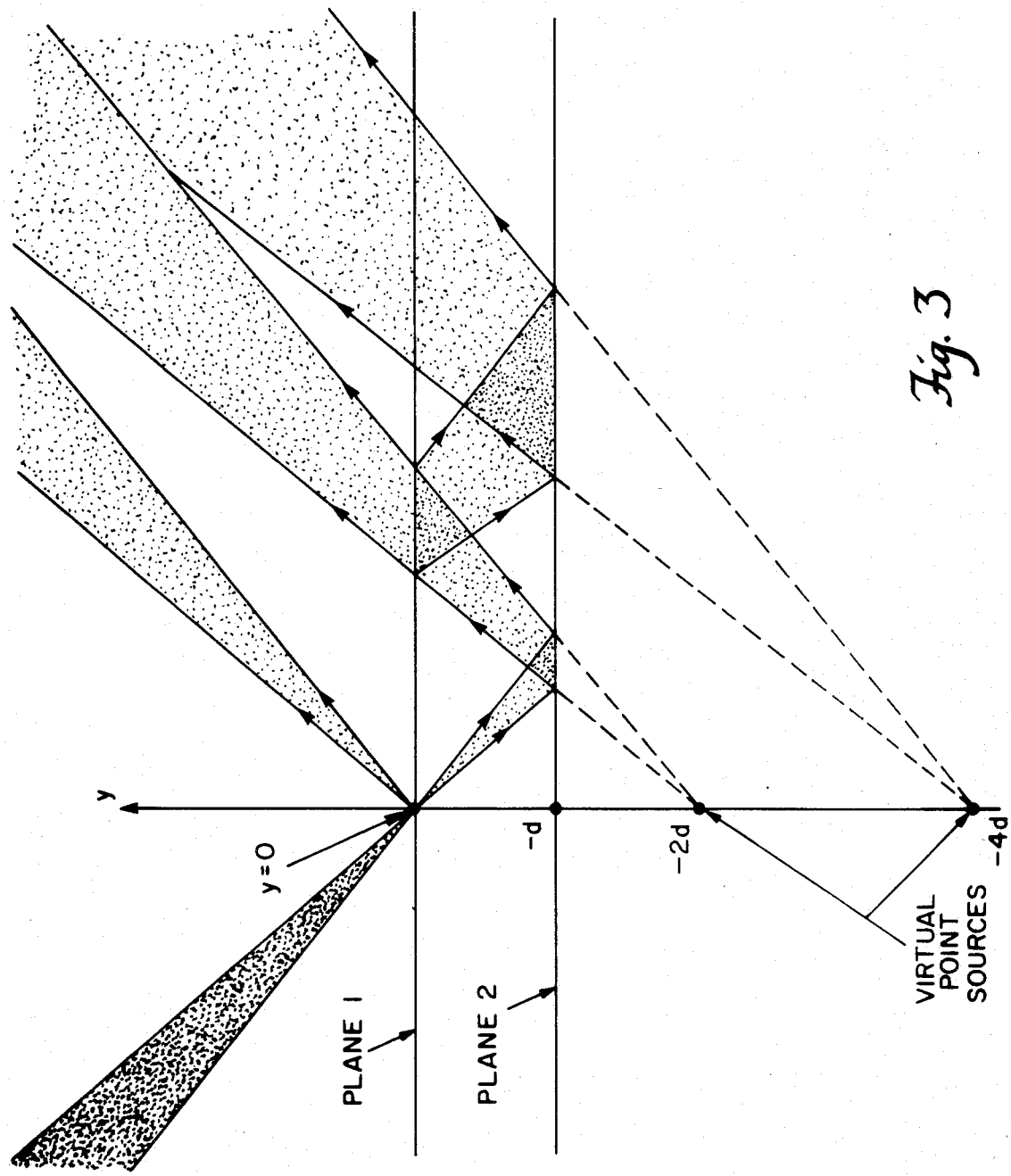
FIG. 3 is an enlarged view of a portion of FIG. 1 helpful in understanding how the interference patterns are formed.

Referring to FIG. 3, there is shown a magnified view of a portion of FIG. 2 above and below point 13 helpful in understanding the interference process represented by virtual point sources that are images of point 13. The first reflection from substrate 23 may be regarded as originating from a point −2d below point 13. Some of this energy is transmitted through mask 14, but a portion of it is reflected back upon mask 23 and reflected toward imager 16 that may be regarded as appearing to originate from a virtual point source −4d below point 13. These effects may be compensated for in a known manner by correlation techniques.

The light intensity at the imager can be modeled as the optical field of an array of uniformly spaced point sources. Simple ray tracing shows that there will be virtual point sources at y=2nd for n=0,1,2,3 ... ∞ and the intensity of the virtual sources will decrease with increasing n. The contributions of these virtual sources can be summed to compute the light intensity (video signal) versus imager coordinates:

$$I(d,x) = \left| R_1^{\frac{1}{2}} e^{j\frac{2\pi}{\lambda}(x^2+l^2)^{\frac{1}{2}}} + \right. \tag{1}$$

$$\sum_{n=1}^{\infty} R_1^{(n-1)/2} R_2^{n/2} T_1 e^{j\frac{2\pi}{\lambda}((x+2nd\cos\theta)2+(l+2nd\sin\theta)2)\frac{1}{2}} \Bigg|^2 \quad$$

Where the plane of the imager is at an angle $\theta$ from plane 1, and the center of the imager, $x=0$, is a distance $l$ from the focal point in plane 1. $R_1$ and $T_1$ are the reflectivity and transmissivity of plane 1, $R_2$ is the reflectivity of plane 2, and $\lambda$ is the wavelength of the laser. The analysis of light intensity $I(d,x)$ versus gap can be simplified by truncating the summation in equation 1.

Therefore consider evaluating $I(d,x)$ for $n=1$ and expanding the resulting intensity expression around $x=0$ for $d/l<<1$, $x/l$ small, and $\theta=45°$. This calculation yields a simplified intensity expression, $g(d,x)$:

$$g(d,x) = R_1 + R_2 T_1^2 + \quad (2)$$

$$2R_1^{\frac{1}{2}} R_2^{\frac{1}{2}} T_1 \cos \frac{2\pi}{\lambda} \left( \sqrt{2}\, d \left(1 + \frac{x}{l} - \frac{x^2}{2l^2}\right)\right)$$

Using this simplified expression it is seen that in the plane of the imager the light intensity is nearly periodic having only a slight linear chirp. The gap, d, is simply proportional to the average spatial frequency, f, of the image, that is, $d = \alpha f$ where f is the number of cycles in the image per unit length along the linear imager and $$\alpha = \frac{\lambda l}{\sqrt{2}}$$

is the system constant. The simple linear relationship between gap and spatial frequency in equation 2 suggests a method of extracting gap information from the more complex intensity signal, $I(d,x)$, obtained when multiple reflections are considered. The processing is done by finding the maximum with respect to f, $f_{max}$, of the magnitude of the following integral:

$$\int_{-x_o}^{x_o} I'(d,x) e^{j2\pi f(x - \frac{x^2}{2l})} dx \quad (3)$$

where $$I'(d,x) = I(d,x) - \frac{1}{2x_o} \int_{-x_o}^{x_o} I(d,x)\, dx \quad (4)$$

Equation 3 represents the correlation of the intensity signal $I'(d,x)$ with the complex chirped exponential suggested by equation 2. Equation 4 defines $I'(d,x)$ to have an average value of zero.

Figure 4A:
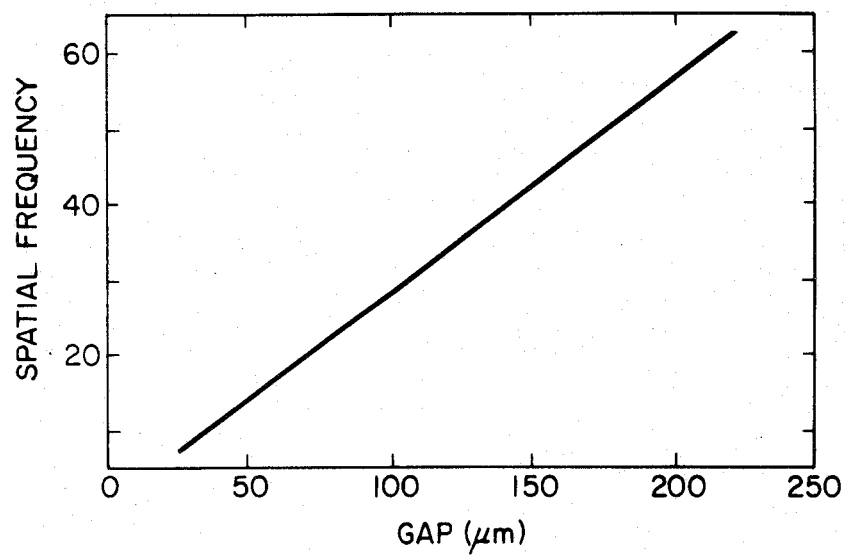
FIGS. 4A and 4B are plots of calculated spatial frequency and error from linearity, respectively, as a function of gap distance.
Figure 4B:
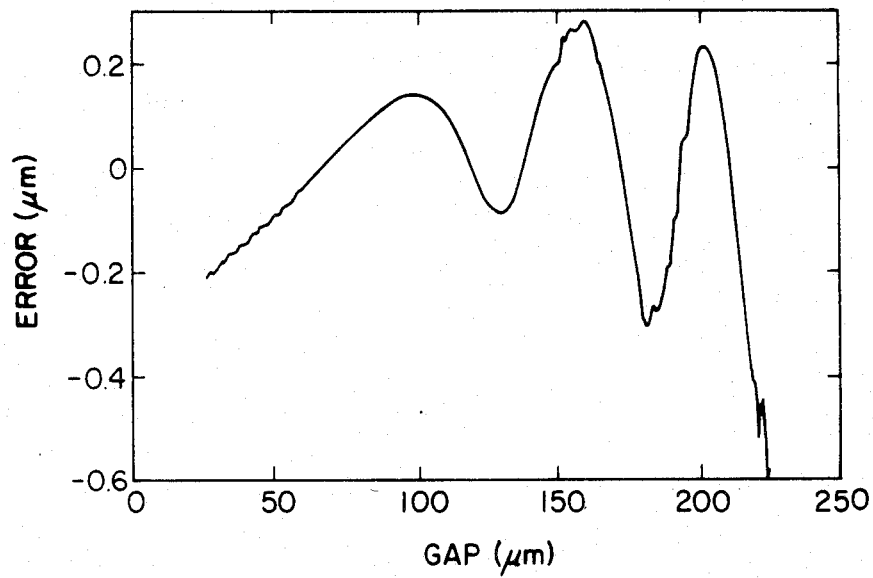

FIG. 4A illustrates a plot of the calculated spatial frequency $f_{max}$ versus gap for the case of $n=5$. This plot indicates that the gap can be calculated as $d_c = \alpha f_{max}$, where $\alpha$ is the slope of the line as determined by a least squares linear fit to the calculated $f_{max}$ data. The residual error $d - \alpha f_{max}$ is less than $\pm 1\%$ over the range 20 $\mu m < d < 200\ \mu m$, as illustrated in FIG. 4B. Over a more restricted range 20 $\mu m < d < 120\mu$, a slight adjustment to the value of $\alpha$ will yield an error of less than $\pm 0.2\%$.

Figure 5:
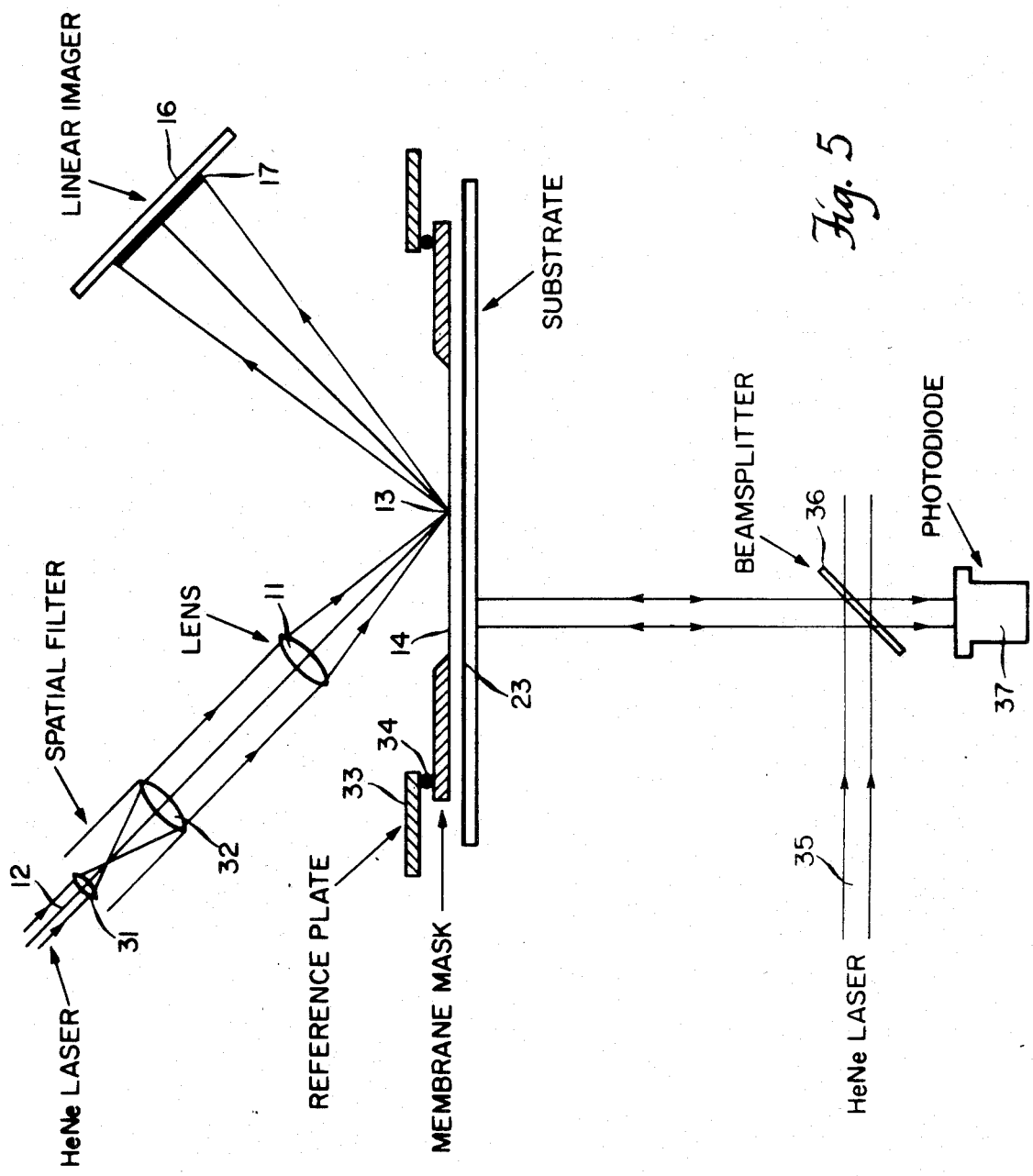
FIG. 5 is a diagrammatic representation of the embodiment of FIG. 1 in an experimental system verifying the calculated relations.

An experimental test of the gap measurement scheme was performed. FIG. 5 shows the configuration which was used. A very thin (40 nm thick) $Si_3N_4$ membrane mask 14 with 5 nm of chromium on the lower surface was used for the experiment. This mask structure approximates the zero thickness mask shown as plane 1 in FIG. 2. In a practical lithographic system, where a thicker and more durable mask is often desirable, an antireflection coating may be desirable to reduce the effect of reflections from the top surface of mask 14. The substrate 23 corresponding to plane 2 consisted of 1.5-mm-thick glass plate with a highly reflective aluminum layer on the surface facing mask 14. Parallelism between mask and substrate was established by observing the pattern of interference fringes in a wide area laser beam 35 normally incident from the backside of the substrate after reflection from beamsplitter 36. Relative displacement between mask 14 and substrate 23 was measured with an accuracy of $\approx 20$ nm by counting interference fringes using diode detector 37 as shown in FIG. 5.

The distance from the focal point 13 on mask 14 to the center of the imaging array 17, l, was 50.8 mm and $\theta = 45°$ (FIG. 2). A 256 element linear imaging array 17 with a pixel spacing of 25 $\mu$m commercially available from Reticon was used. Imager data video signals provided by array 17 was digitized and recorded at a series of gaps spaced at 316.4 nm as determined from the fringe counting over a gap range of 25 $\mu$m to 120 $\mu$m. Since the laser illumination and imager response vary somewhat versus x, it was found advantageous to multiply the imager data by a "correction function." The function used was simply the inverse of the imager response with plane 2 (FIG. 2) removed. Then the "corrected" data was multiplied by a triangular window to reduce the effects of finite array length on the computation. The value of $f_{max}$ for each signal was determined using a computer. This peak data was then fitted to a straight line, and the system constant, $\alpha$, was determined from the slope of this line. The deviation of the points from the line was used to compute the system error.

Figures 6A, 6B, 6C:
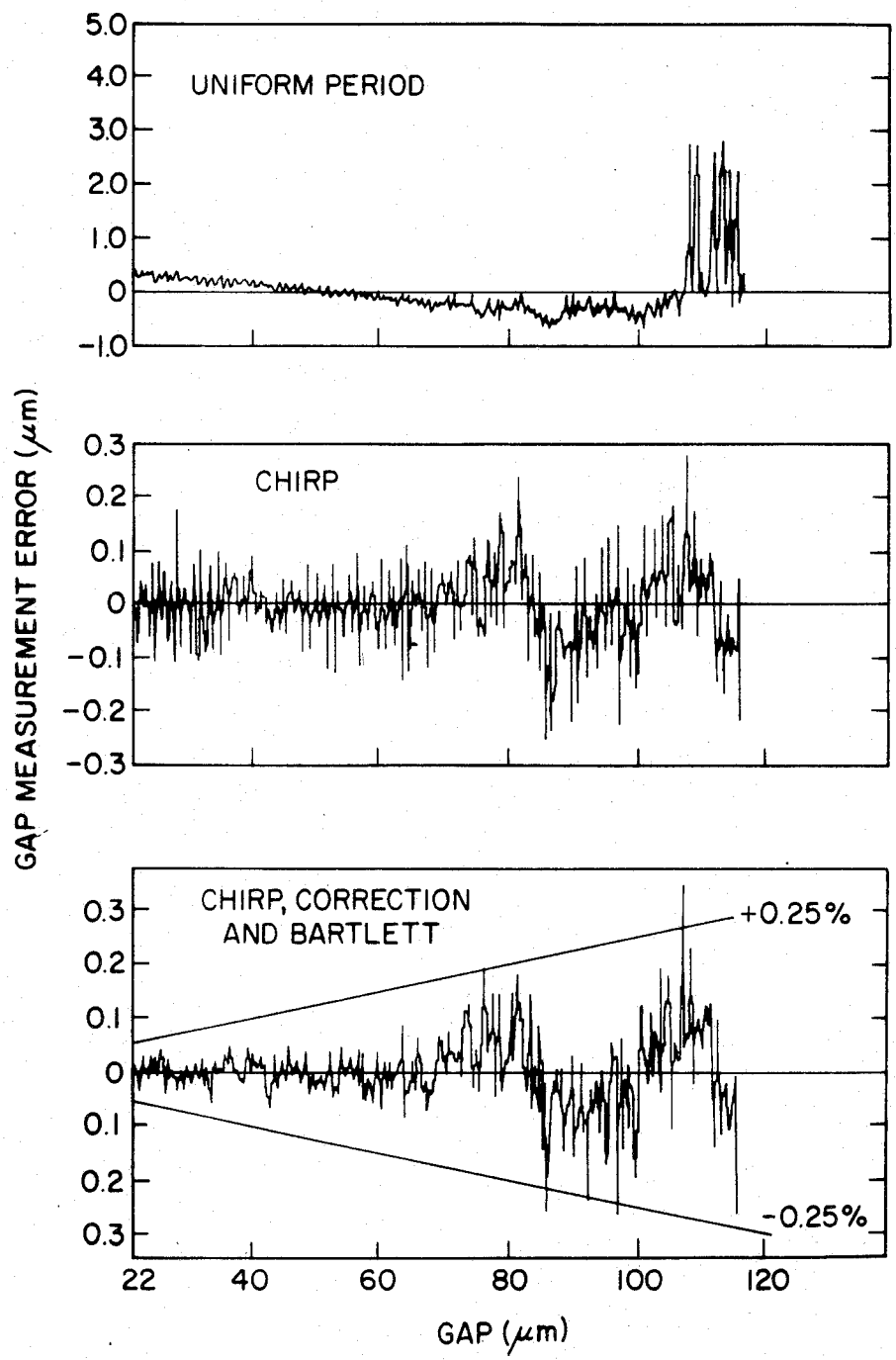
FIGS. 6A–6C show the experimental results of the gap measurement system error.

FIGS. 6A–6C show the measured system error versus gap for a variety of signal processing algorithms. FIG. 6A shows the frequency chirp in the correlation computation has been eliminated by removing the $x^2$ term in equation 3. This results in large errors at large gaps since the chirp is most noticeable at large gaps. FIG. 6B shows the results when the frequency chirp is included. FIG. 6C illustrates that the system error can be reduced, especially at small gaps, if the intensity is corrected for nonuniformity and windowed by a triangular window. In this case a $\pm 0.25\%$ accuracy is achieved.

Figure 7:
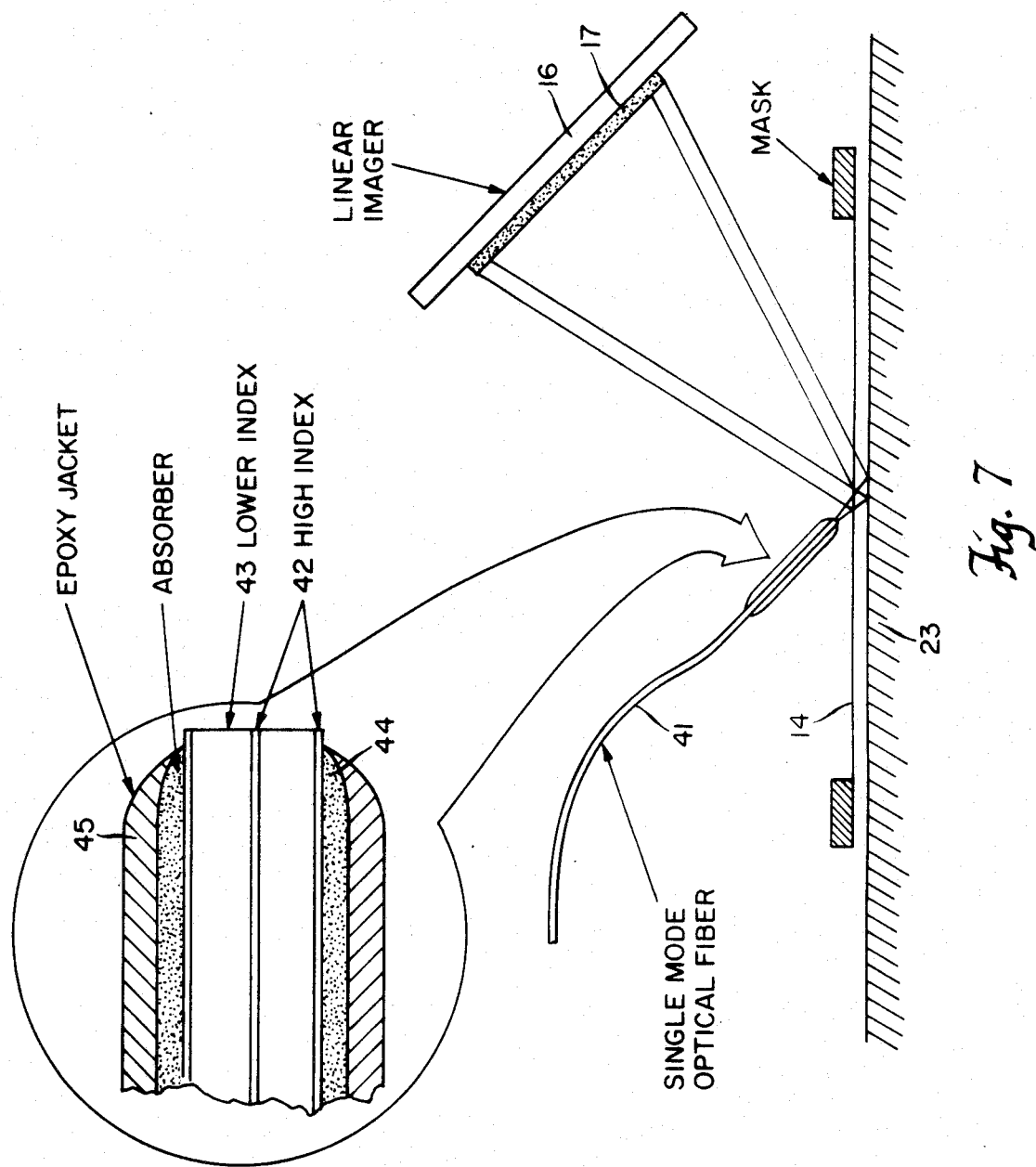

Referring to FIG. 7 there is shown a simpler and more compact scheme than the system of FIG. 1, which uses the diverging beam from the end of a single mode optical fiber 41 in place of the focused laser. A remotely placed He-Ne laser (not shown) illuminates optical fiber 41. The detail in FIG. 7A illustrates a cross section of the ITT T-1601 single mode optical fiber used in the experiments. The laser beam propagates along the 4.0 $\mu$m diameter high index core 42, separated by lower index core 43. The protective plastic jacket has been stripped from the cable and an absorbing coating 44 of India ink covered by an epoxy jacket 45 has been applied to attenuate the unwanted cladding modes. The end of the fiber has been cleaved to form a flat, perpendicular end face as described in reference 5. A mirror may be inserted in the path of the reflected beams to fold the optical path and make the apparatus more compact.

Figure 8:
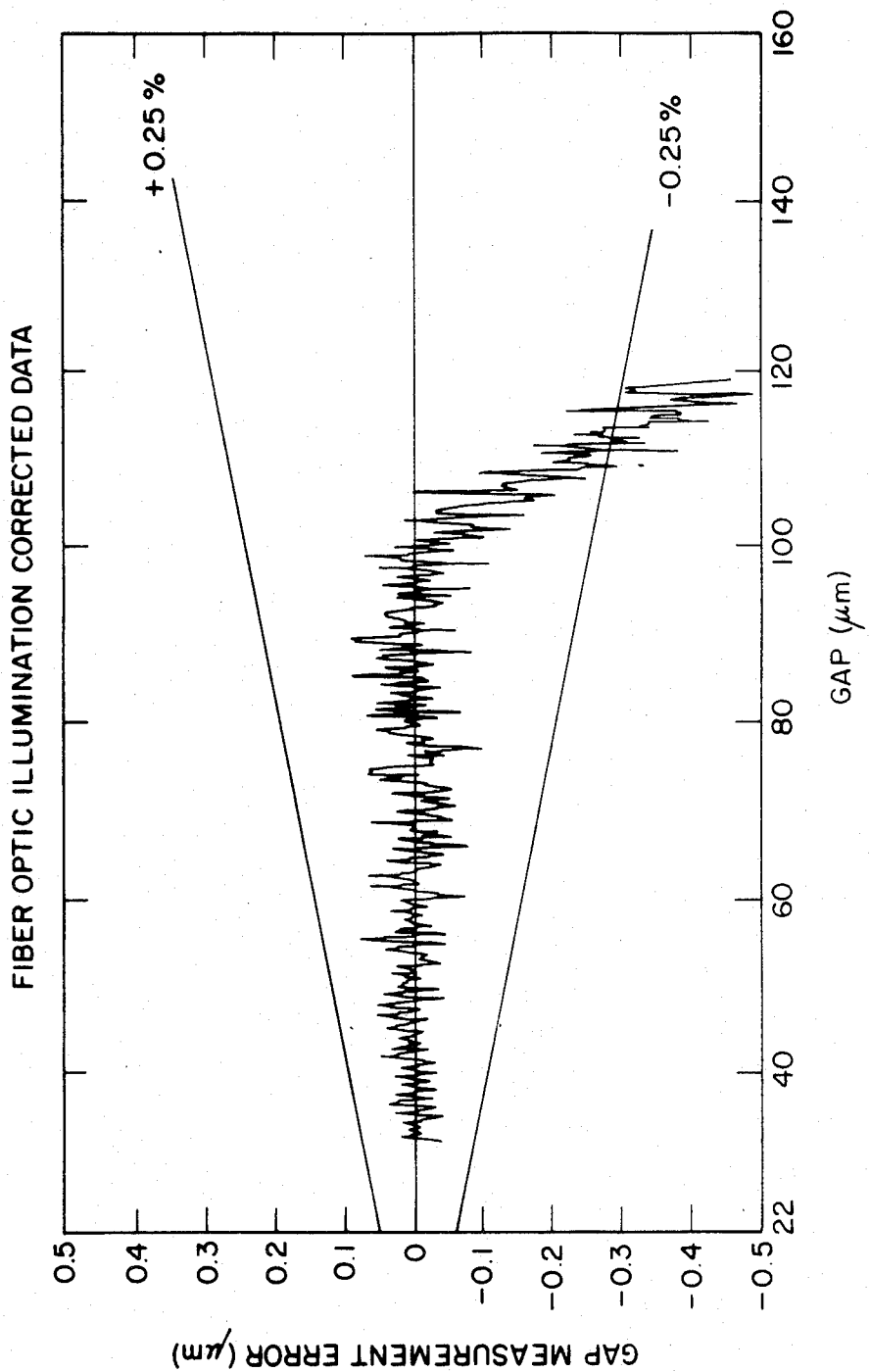
FIG. 8 shows the experimental results of the gap measurement system error using fiberoptic illumination.

The fiber optic illuminator 41 was tested experimentally using the procedure previously described in connection with FIG. 5. Data from the imager was corrected for nonuniformities in the illumination and detector responses. The data was windowed by a triangular window and processed using the chirp correlation algorithm described. The resulting measurement error versus gap is illustrated in FIG. 8. In this case a ±0.25% accuracy is achieved over a range of 30-110 μm.

Figure 9:
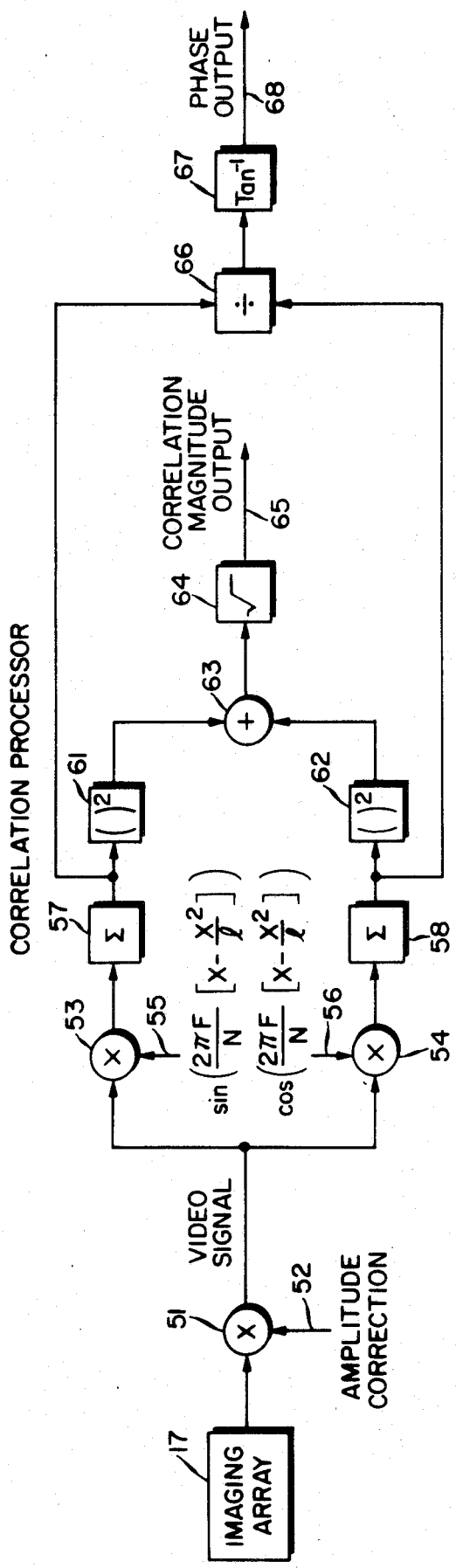
FIG. 9 is a block diagram illustrating the logical arrangement of a suitable correlation processor for processing the video signal provided by the imaging array.

Referring to FIG. 9, there is shown a block diagram illustrating the logical arrangement of a suitable correlation processor for processing the video signal provided by imaging array 17. This signal may be digitized and applied to multiplier 51 that receives an amplitude correction signal on line 52 that typically represents the inverse of the beam intensity as a function of radius detected by imaging array 17 with substrate 23 absent. This corrected video signal is applied to sine multiplier 53 and cosine multiplier 54 for multiplication by the sine and cosine signals indicated on lines 55 and 56, respectively, typically generated by a digital computer for each expected spatial frequency, preferably with the chirp term as indicated to provide sine and cosine product signals, respectively, to integrators 57 and 58, respectively. Integrators 57 and 58 deliver the integrated sine and cosine signals, respectively, to sine and cosine squarers 61 and 62, respectively. Adder 63 receives the squared integrated sine and cosine signals from squarers 61 and 62, respectively, to provide a sum signal to square rooter 64 which provides the correlation magnitude output signal on output terminal 65, typically in a form that may be plotted as shown in FIG. 10.

For detecting small changes in gap width, the ratio of the integrated sine and cosine signals at the output of integrators 57 and 58 is related to phase, and these signals may be applied to divider 66 to provide a quotient signal that is applied to $\tan^{-1}$ circuit 67 that provides a signal on output terminal 68 representative of the relative phase between the sine integrated and cosine integrated signals.

Figure 10:
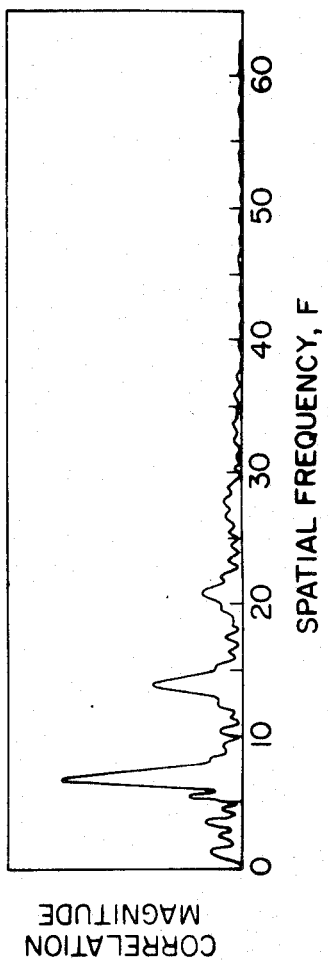
FIG. 10 shows a typical correlation magnitude as a function of spatial frequency.

Referring to FIG. 10, there is shown a typical correlation magnitude as a function of spatial frequency. Although maxima are produced at a number of spatial frequencies, the fundamental is readily observable and may be used as a measure of gap width.

The invention has many attractive features. It does not require mechanical or electrical contact to mask or substrate. Special marks are not needed. The system is mechanically simple, easy to calibrate, and potentially very fast. The signal processing can be implemented using current generation microprocessor components. By using the diverging beam from the end of a single mode optical fiber in place of the focused laser beam the gap sensor can be made very compact.

The accuracy of this gap measurement technique depends upon the accuracy of the knowledge of the system constant. The system constant can be determined by the previously described least squares linear fit procedure. Using this calibration technique, measurement accuracy of ±0.25% over the gap range of 25 to 120 μm has been demonstrated experimentally. It may be more convenient to determine the system constant by measuring calibrated gap standards using the system, or by accurately measuring the system geometry and calculating the constant. Calculation of the constant to an accuracy of ±0.1% may be achieved with the system assembled or measured with an accuracy of ±50 μm. This accuracy can easily be obtained in standard machining practice.

REFERENCES

1. B. Fay, A. Cornette, and J. P. Nivoliers, 1982 International Electron Devices Technical Digest (IEEE, Piscataway, NJ) pg. 411.
2. J. L. Bartelt, C. W. Slayman, J. E. Wood, J. Y. Chen, C. M. McKenna, C. P. Minning, J. E. Coakley, R. E. Holman, and C. M. Perrygo, J. Vac. Sci. Technol. 19, 1166, 1981.
3. B. Fay, J. Trotel, and A. Frichet, J. Vac. Sci. Technol. 16, 1954, 1979.
4. T. M. Lyszczarz, D. C. Flanders, N. P. Economou, and P. D. DeGraff, J. Vac. Sci. Technol. 19, 1214, 1981.
5. D. Gloge, P. W. Smith, D. L. Bisbec, and E. L. Chinnock, Bell Syst. Tech. J. 52, 1579, 1973.

Numerous means for processing the signals provided by linear imager 16 are apparent to those skilled in the art who may use microprocessors, or determine spatial frequency manually. For example, linear imager 16 might be a photographic plate upon which an interference pattern is produced with fringes that may be measured to determine spatial frequency and gap width. The microprocessor processing of signals provided by an array 17 is preferred to provide a rapid indication of the gap width and permit adjustment to a desired value.

There has been described novel apparatus and techniques for rapidly and accurately determining the gap width between a mask and substrate. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:
1. Gap measuring apparatus for indicating the gap between a mask and substrate comprising,
   said mask,
   said substrate,
   a source of collimated optical energy,
   means for focusing said optical energy upon said mask and directing some of said optical energy through said mask upon said substrate,
   imaging means for receiving said optical energy reflected from said mask and from said substrate through said mask,
   some of the focused energy being reflected from said mask and some from said substrate after passing through said mask to form an interference pattern on said imaging means of spatial frequency representative of the gap distance between said substrate and said mask.
2. Gap measuring apparatus in accordance with claim 1 wherein said source of a collimated beam is a laser with the collimated beam axis generally parallel to the plane of said imaging means.
3. Gap measuring apparatus in accordance with claim 1 wherein said gap is less than 500 microns.
4. Gap measuring apparatus in accordance with claim 2 wherein said gap is less than 500 microns.

5. A method of providing an indication of the distance between a mask and a substrate which method includes the steps of, focusing a collimated beam of optical energy upon said mask and directing some of said optical energy through said mask upon said substrate to reflect some of the focused energy from said mask and some of the focused energy from said substrate after transmission through said mask to produce in an image plane an interference pattern between the energy reflected from said mask and the energy reflected from said substrate through said mask representative of the gap distance between said substrate and said mask, and sensing the interference pattern produced in said image plane to obtain an indication of said gap distance.

6. Gap measuring apparatus in accordance with claim 2 wherein said source of a collimated beam further comprises optical fiber means adjacent to said mask for coupling energy from said laser to said mask.

7. Gap measuring apparatus in accordance with claim 6 wherein said optical fiber means comprises a single mode optical fiber having a lower index portion separating high index portions and having an end section circumferentially surrounded by absorber means for attenuating unwanted cladding modes.

8. Gap measuring apparatus in accordance with claim 7 wherein the end of said optical fiber means adjacent said mask is formed with a flat end face perpendicular to the axis of said optical fiber means.

9. Gap measuring apparatus in accordance with claim 1 wherein said imaging means comprises photoelectric transducing means for providing a video signal representative of said interference pattern on said imaging means, and processing means responsive to said video signal for providing a signal representative of said spatial frequency.

10. Gap measuring apparatus in accordance with claim 9 wherein said processing means comprises, a source of a set of correlating signals each representative of a spatial frequency within an expected range, means for crosscorrelating said correlating signals with said video signal to provide a correlation signal having a peak when crosscorrelated with a correlating signal in that set of that spatial frequency.

11. Gap measuring apparatus in accordance with claim 10 wherein said set of correlating signals includes a set of pairs of correlating signals in time quadrature, and said correlating means includes sine and cosine channels for correlating said video signal with respective ones of said correlating signals in each pair to produce sine and cosine correlated signals, and means for combining said sine and cosine correlated signals to provide an output signal representative of the correlation magnitude.

12. Gap measuring apparatus in accordance with claim 11 wherein each of said correlating channels comprises, multiplying means for multiplying said video signal with a respective one of said correlating signals in a pair, integrating means for integrating the output signal provided by said multiplying means, and squaring means for squaring the output signal provided by said integrating means, and said correlating means further comprises square rooting means for square rooting the signal provided by said combining means.

13. Gap measuring apparatus in accordance with claim 12 and further comprising, means for sensing the ratio of the signals provided by said integrating means for providing a signal representative of the relative phase of the signals in said sine and cosine channels.

* * * * *